United States Patent [19]
Williams et al.

[11] Patent Number: 5,545,846
[45] Date of Patent: Aug. 13, 1996

[54] LASER BOND HEADER

[75] Inventors: Charles E. Williams, Dallas; Dennis D. Davis, Garland; David Kee, Richardson, all of Tex.

[73] Assignee: Texas Instruments Incorporated, Dallas, Tex.

[21] Appl. No.: 129,836

[22] Filed: Sep. 30, 1993

[51] Int. Cl.$^6$ .................................................. H01L 21/58
[52] U.S. Cl. .............................. 174/51; 174/52.5; 29/879; 257/692
[58] Field of Search ................. 174/51–52.4, 52.5, 174/94 R, 267; 257/668, 676, 692; 29/877, 878, 879

[56] References Cited

U.S. PATENT DOCUMENTS 3,643,006  2/1972  Ance ................................ 174/94 R X
4,453,033  6/1984  Duff et al. ........................... 174/52.4

*Primary Examiner*—Kristine L. Kincaid
*Assistant Examiner*—Paramita Ghosh
*Attorney, Agent, or Firm*—Mark E. Courtney; W. James Brady, III; Richard L. Donaldson

[57] ABSTRACT

The invention is to a header for a power semiconductor device and a method for making the header. A ground pin is mounted or formed on the header mounting base and a header ground lead is placed over the ground pin and fused to the pin by a laser beam.

16 Claims, 2 Drawing Sheets

LASER BOND HEADER

FIELD OF THE INVENTION

This invention relates to headers for semiconductor devices, and more particularly to a header having a ground post laser bonded to a lead frame ground lead.

BACKGROUND OF THE INVENTION

Power transistors carry large currents, and to provide for this current, multiple ground leads are connected from the semiconductor chip to a mounting base on the lead frame. Often this mounting base serves also as a heat sink. To accommodate the current flow from the mounting base to a ground lead on the lead frame, multiple wires are needed. Any faulty bonding or breaking of any of these wires presents problems in that the remaining wires may not have sufficient current handle carrying capacity to adequately handle current through the semiconductor. An alternate method is to mechanically join the leads and the heat sink. However this connection is unreliable because it can become open during thermal cycling.

SUMMARY OF THE INVENTION

The invention is to a lead frame that has a single ground post on the semiconductor chip mounting base. This ground post may be extruded from the metal of the base, or may be a post securely mechanically and electrically attached to the mounting tab. The ground lead of the lead frame is placed over the ground post and then bonded there with a laser beam fusing the metal of the ground post with the metal of the lead frame ground lead.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
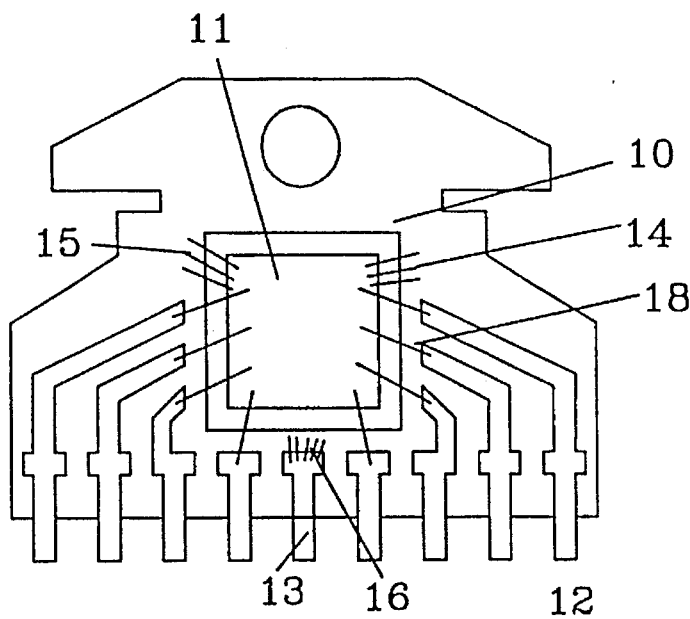
FIG. 1 shows multiple ground connections according to the prior art.

FIG. 1 illustrates a prior art device showing a header base 10 having a semiconductor chip 11 mounted thereon. Header 10 includes a plurality of leads 12, one of which 13 is the ground lead for the device. Semiconductor chip 11 is connected to the header base tab by a plurality of leads indicated at 14 and 15. The header base is then connected to ground lead 13 by multiple wires 16. The ground bonds formed by wires 14, 15 and 16 are required because the current handling capacity of a single wire is not sufficient. In order to use a single bonder to bond the other leads 18 to the semiconductor chip, the multiple wires are used for the ground lead.

Figure 2:
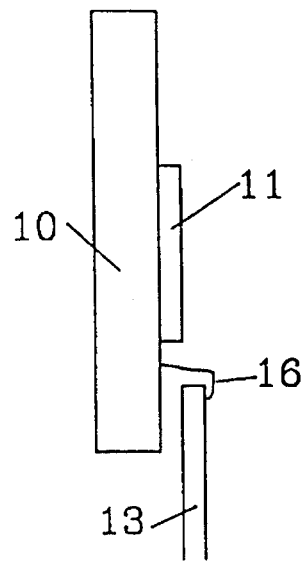
FIG. 2 is a side view of FIG. 1.

FIG. 2 is a side view showing the wire bond between header lead 13 and the connection wires 16.

Figure 3:
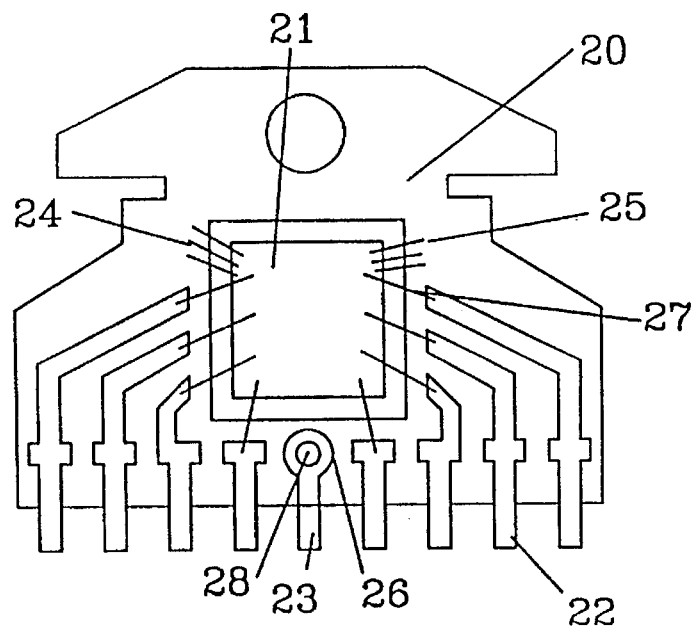
FIG. 3 show the ground post of the present invention.

FIG. 3 shows a header and semiconductor chip mounted thereon according to the present invention. Header 20 has a semiconductor chip 21 mounted thereon and interconnected to header leads 22 with bond wires 27. There are a plurality of bond wires 24 and 25 providing ground wires from semiconductor chip 21 to header 20. To connected the ground connection of header 20, a post 28 is provided on header 20, and header lead 23 has an end 26 that has a central opening 29 that is placed down over post 28. After placing header lead 26 over post 28, then post 28 and header lead 26 are bonded together by, for example, a laser fusing process where both the metal of post 28 and lead end 26 are fused together. The fusing of the metal makes a better and sturdier connection since a solder connection is subject to corrosion or a bad solder connection and mechanical connections can flex open and are subject to thermal damage. Post 28 and lead end 26 may be, for example, copper, or may have a low temperature material plated thereon to provide a fusible material.

Figure 4:
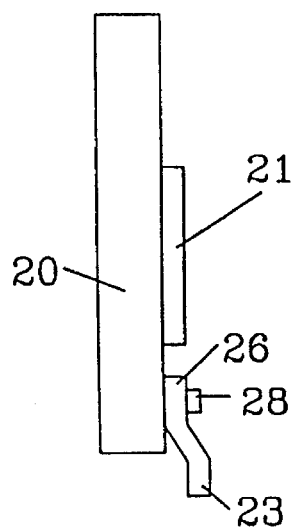
FIG. 4 is a side view of FIG. 3.

FIG. 4 is a side view, in part, of FIG. 3, showing the side of the header 20, semiconductor chip 21, and header lead end 26 over post 28.

Figure 5:
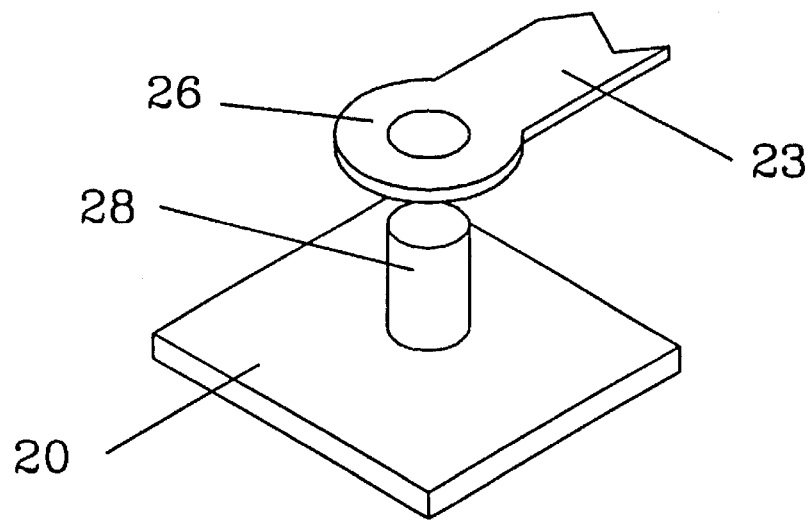
FIG. 5 is an example of a ground post and ground lead.

Post 28 may be a separate post that is secured to header 20, or may be a portion of header 20 extruded to form the post. The ground post 28 and ground lead 23 are illustrated in FIG. 5 with the ground lead positioned above the ground post.

Figure 6:
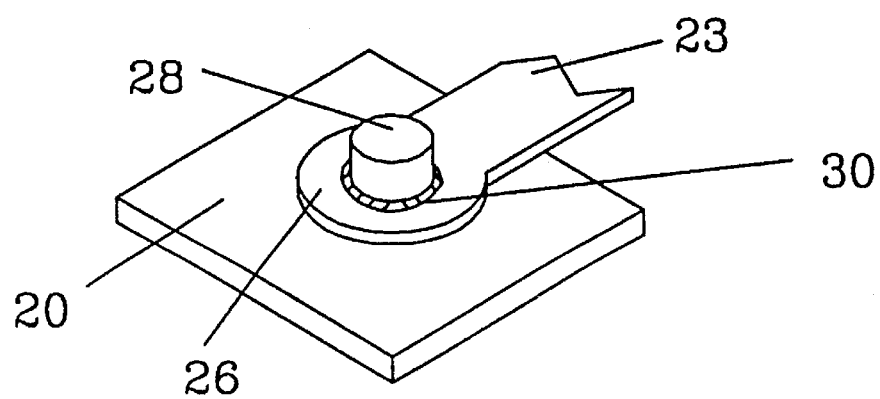
FIG. 6 shows the header ground lead on the ground post.

FIG. 6 shows the ground lead 23 on the ground post 28 and laser bonded at 30.

Figure 7:
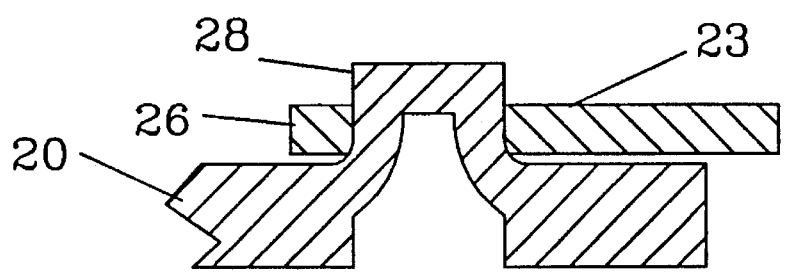
FIG. 7 is a cross-sectional view of the ground post

FIG. 7 is a cross-sectional view of the extruded post 28 with ground lead 23 mounted around ground post 28.

What is claimed:

1. A header for power semiconductor devices, comprising:
    a header with a mounting base and leads;
    a ground post on said mounting base;
    at least one of said leads with an opening in one end to fit over said ground post; and
    a bond between said at least one of said leads and said ground post.

2. The header according to claim 1, wherein said ground post is a pin mounted on said mounting base.

3. The header according to claim 1, wherein said ground post is extruded from said mounting base.

4. The header according to claim 1, wherein said ground post and said at least one of said leads are of copper.

5. The header according to claim 1, wherein said ground post and said at least one of said leads are coated with a heat fusible metal.

6. The header according to claim 1, wherein said ground post comprises metal and wherein the bond between said at least one of said header leads and said ground post is a laser beam fusion of the metal of the ground post and said at least one of said header leads.

7. A header for power semiconductor devices, comprising:
    a header with a mounting base and leads;
    a ground post on said mounting base extruded from said header base material;
    at least one of said leads with an opening in one end to fit over said ground post; and
    a bond between said at least one of said leads and said ground post.

8. The header according to claim 7, wherein said ground post and said at least one of said leads are of copper.

9. The header according to claim 7, wherein said ground post and said at least one of said leads are coated with a heat fusible metal.

10. The header according to claim 7, wherein the ground post comprises metal and wherein the bond between said at least one of said header leads and said ground post is a laser beam fusion of the metal of the ground post and said at least one of said header leads.

11. A method for providing a ground lead connection between a header ground lead and a header mounting base, comprising the steps of:

mounting a ground pin on said header mounting base adjacent to the header ground lead;

placing one end of the header ground lead having an opening therein over said ground pin; and fusing a material of the ground pin with a material of the ground header lead.

12. The method according to claim 11, wherein the step of fusing includes fusing the two materials with a laser beam.

13. The method according to claim 11, wherein said ground pin is extruded from the header mounting base.

14. The method according to claim 11, wherein said material of the ground pin and said material of the header ground lead are copper.

15. The method according to claim 11, wherein said materials are fusible material plated on said header ground pin and said header ground lead.

16. A method for providing a ground lead connection between a header ground lead and a header mounting base, comprising the steps of:

mounting a ground pin on said header mounting base adjacent to the header ground lead;

placing one end of the header ground lead having an opening therein over said ground pin; and laser fusing a material of the ground pin with the a material of the ground header lead.

\* \* \* \* \*